(12) United States Patent
Chae et al.

(10) Patent No.: US 8,487,334 B2
(45) Date of Patent: Jul. 16, 2013

(54) SEMICONDUCTOR LIGHT EMITTING DIODE CHIP AND LIGHT EMITTING DEVICE USING THE SAME

(75) Inventors: Seung Wan Chae, Yongin (KR); Tae Hun Kim, Anyang (KR); Su Yeol Lee, Seongnam (KR); Sung Tae Kim, Seoul (KR); Jong Ho Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 78 days.

(21) Appl. No.: 13/279,782

(22) Filed: Oct. 24, 2011

(65) Prior Publication Data
US 2012/0286309 A1    Nov. 15, 2012

(30) Foreign Application Priority Data
May 13, 2011 (KR) .......................... 10-2011-0044955

(51) Int. Cl.
*H01L 33/00* (2010.01)
(52) U.S. Cl.
USPC .............................................. 257/98; 257/79
(58) Field of Classification Search
USPC ...................................................... 257/79, 98
See application file for complete search history.

(56) References Cited

U.S. PATENT DOCUMENTS

| | | | |
|---|---|---|---|
| 6,643,304 B1 | 11/2003 | Chen et al. | |
| 6,787,435 B2 | 9/2004 | Gibb et al. | |
| 6,949,395 B2 | 9/2005 | Yoo | |
| 7,148,514 B2 * | 12/2006 | Seo et al. | 257/79 |
| 7,211,833 B2 | 5/2007 | Slater, Jr. et al. | |
| 8,217,488 B2 * | 7/2012 | Chen et al. | 257/507 |

FOREIGN PATENT DOCUMENTS
JP          8-102549 A     4/1996

* cited by examiner

*Primary Examiner* — Douglas Menz
(74) *Attorney, Agent, or Firm* — Sughrue Mion, PLLC

(57) ABSTRACT

A semiconductor light emitting device includes: a light emitting diode unit including a light-transmissive substrate having a face sloped upwardly at a lower edge thereof. A rear reflective lamination body is formed on the lower face and the surrounding sloped face of the light-transmissive substrate. The rear reflective lamination body includes an optical auxiliary layer and a metal reflective film formed on a lower face of the optical auxiliary layer. A junction lamination body is provided to a lower face of the rear reflective lamination body. The junction lamination body including a junction metal layer made of a eutectic metal material and a diffusion barrier film.

16 Claims, 7 Drawing Sheets

SEMICONDUCTOR LIGHT EMITTING DIODE CHIP AND LIGHT EMITTING DEVICE USING THE SAME

CROSS-REFERENCE TO RELATED APPLICATIONS

This application claims the priority of Korean Patent Application No. 10-2011-0044955 filed on May 13, 2011, in the Korean Intellectual Property Office, the disclosure of which is incorporated herein by reference.

BACKGROUND OF THE INVENTION

1. Field of the Invention

The present invention relates to a semiconductor light emitting diode chip and, more particularly, to a semiconductor light emitting diode chip and a light emitting device using the same capable of reducing optical loss by improving reflection efficiency, and effectively releasing heat.

2. Description of the Related Art

A light emitting diode (LED), a semiconductor element for converting electrical energy into optical energy, is configured as a compound semiconductor emitting light of a particular wavelength according to an energy band gap, and the usage of an LED tends to extend from optical communications devices and mobile displays, displays such as a computer monitor, or the like, a planar (or flat) light source (e.g., a backlight unit (BLU)) for an LCD, and even an illumination area.

Thus, a method of releasing heat in order to deal with a high heating value of an LED is required in various LED application fields. In particular, when the current applied to an individual LED is increased as a method for reducing the number of LEDs in use, the resolution of a heating value increased accordingly has become a critical issue.

In order to release heat, an infinite heat sink, or the like, may be installed at an outer side of the LEDs in a module to perform cooling through forcible convection currents. However, such an addition to the device inevitably leads to an increase in the volume of a product, incurring an additional product cost.

Meanwhile, a semiconductor layer constituting the LED has a high refractive index as compared with external air, an encapsulated material, or a substrate, reducing the critical angle determining an incident angle range in which light can be emitted. As a result, a considerable portion of light generated from an active layer is totally internally reflected so as to spread in a substantially undesired direction or be lost in a total internal reflection process, lowering light extraction efficiency. Thus, a method for improving substantial luminance by increasing the quantity of light that proceeds in a desired direction is required.

SUMMARY OF THE INVENTION

An aspect of the present invention provides a semiconductor light emitting diode (LED) chip capable of remarkably improving heat resistance at an interface between the LED chip and a package and employing a noble metal reflective structure guaranteeing high reflectance (or reflectivity), and a light emitting device having the same.

According to an aspect of the present invention, there is provided a semiconductor light emitting device including: a semiconductor light emitting diode including a light-transmissive substrate having a face sloped upwardly at a lower edge thereof, and a first conductive semiconductor layer, an active layer, and a second conductive semiconductor layer sequentially formed on the upper face of the light-transmissive substrate; a rear reflective lamination body formed on the lower face and the surrounding sloped face of the light-transmissive substrate and including an optical auxiliary layer made of a material having a certain refractive index and a metal reflective film formed on a lower face of the optical auxiliary layer; and a junction lamination body provided to a lower face of the rear reflective lamination body and including a junction metal layer made of a eutectic metal material and a diffusion barrier film formed to prevent an element from being diffused between the junction metal layer and the metal reflective film.

The eutectic metal material of the junction metal layer may contain at least one of gold (Au), silver (Ag), and tin (Sn). The eutectic metal material of the junction metal layer may include Au—Sn.

The metal reflective film may include aluminum (Al), silver (Ag), and an alloy containing at least one of aluminum (Al) and silver (Ag). The diffusion barrier film may include a material selected from among titanium (Ti), nickel (Ni), chromium (Cr), gold (Au), TiW, TiN, and a combination thereof.

The optical auxiliary layer may be made of an oxide or a nitride including an element selected from the group consisting of silicon (Si), zirconium (Zr), tantalum (Ta), titanium (Ti), indium (In), tin (Sn), magnesium (Mg), and aluminum (Al).

The optical auxiliary layer may have a distributed Bragg reflector (DBR) structure in which two types of dielectric thin films, each having a different refractive index, are alternately laminated. Here, the two types of dielectric thin films may be made of an oxide or a nitride including an element selected from the group consisting of silicon (Si), zirconium (Zr), tantalum (Ta), titanium (Ti), indium (In), tin (Sn), magnesium (Mg), and aluminum (Al).

According to another aspect of the present invention, there is provided a light emitting device including a semiconductor light emitting diode (LED) chip and a support supporting the semiconductor LED chip.

The semiconductor LED chip includes: a light emitting diode unit including a light-transmissive substrate having a face sloped upwardly at a lower edge thereof, and a first conductive semiconductor layer, an active layer, and a second conductive semiconductor layer sequentially formed on the upper face of the light-transmissive substrate; a rear reflective lamination body formed on the lower face and the surrounding sloped face of the light-transmissive substrate and including an optical auxiliary layer made of a material having a certain refractive index and a metal reflective film formed on a lower face of the optical auxiliary layer; and a junction lamination body provided to a lower face of the rear reflective lamination body, having an interface fusion-bonded to the support, and including a junction metal layer made of a eutectic metal material and a diffusion barrier film formed to prevent an element from being diffused between the junction metal layer and the metal reflective film.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
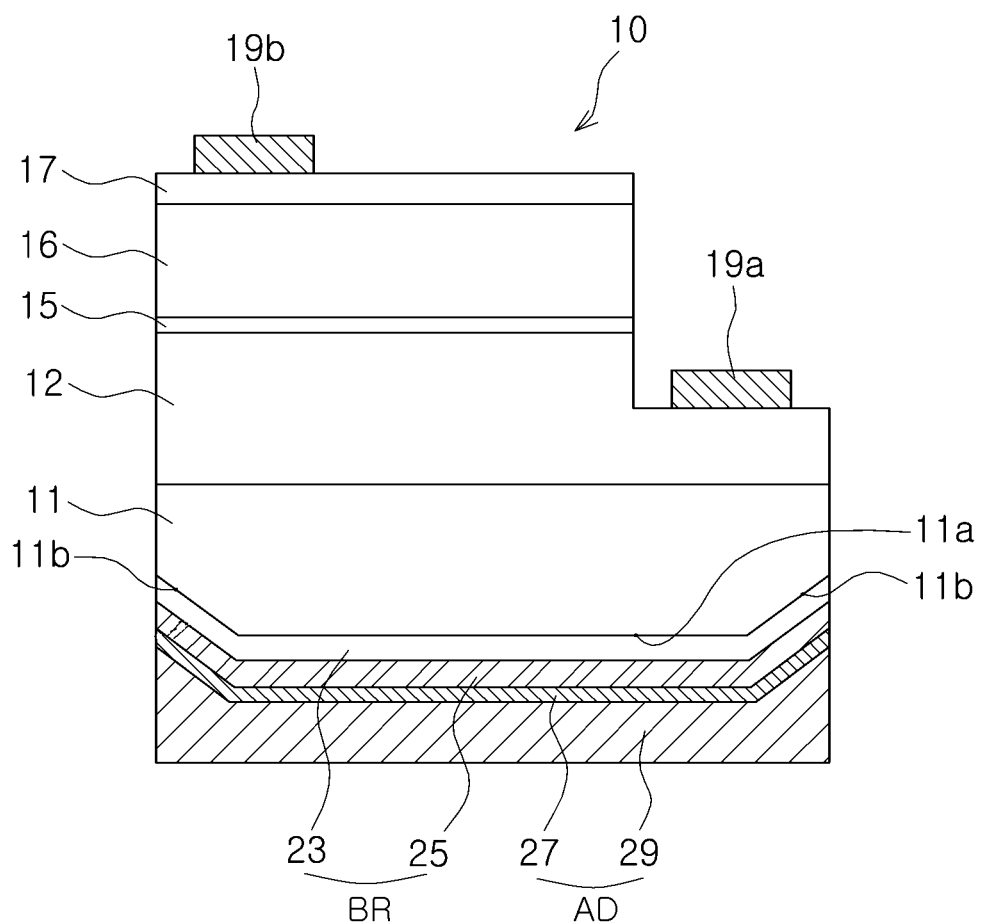
FIG. 1 is a side-sectional view of a semiconductor light emitting device according to an embodiment of the present invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

FIG. 1 is a side-sectional view of a semiconductor light emitting device according to an embodiment of the present invention.

As shown in FIG. 1, a semiconductor light emitting diode (LED) chip 30 includes an LED structure 10 including an n type semiconductor layer 12, an active layer 15, and a p type semiconductor layer 16 sequentially formed on a substrate 11.

The substrate 11 may be a light-transmissive substrate such as sapphire. The n type semiconductor layer 12, the active layer 15, and the p type semiconductor layer 16 may be nitride semiconductor layers.

An n-sided electrode 19a is formed on an upper area of the n type semiconductor layer 12 exposed upon being mesa-etched, and a transparent electrode layer 17 and a p-sided electrode 19b are sequentially formed on an upper surface of the p type semiconductor layer 16. The active layer 15 may have a multi-quantum well structure including a plurality of quantum barrier layers and a plurality of quantum well layers.

The light-transmissive substrate 11 employed in the present embodiment may have a face 11b sloped toward an upper face from the edges of the lower face 11a. Also, a rear reflective lamination body BR is formed on a lower face of the light-transmissive substrate 11 in order to change a direction of light to a desired direction (i.e., a direction in which an epitaxial layer is formed).

In such a structure, since the rear reflective lamination body BR is also formed on the sloped face 11b as well as on the lower face 11a of the light-transmissive substrate 11, emitted light can be effectively extracted in a desired direction (i.e., an upward direction), whereby high luminous intensity can be obtained and a high light harvesting effect can be expected.

As shown in FIG. 1, the rear reflective lamination body BR may include an optical auxiliary layer 23 made of a material having a certain reflective index and a metal reflective film 25 formed on a lower face of the optical auxiliary layer 23.

The optical auxiliary layer 23 employed in the present embodiment may be made of an oxide or a nitride including an element selected from the group consisting of silicon (Si), zirconium (Zr), tantalum (Ta), titanium (Ti), indium (In), tin (Sn), magnesium (Mg), and aluminum (Al), as a material having light transmittance and a certain refractive index. The metal reflective film 25 may include aluminum (Al), silver (Ag), or a mixture thereof. For example, an omni-directional reflector (ODR) may be implemented by forming the optical auxiliary layer 23 which has a thickness satisfying $\lambda/4n$ of a wavelength and a low refractive index on the metal reflective film 25 which has high reflectance, made of a material such as aluminum (Al), silver (Ag), or an alloy containing at least one of aluminum (Al) and silver (Ag).

In this manner, since the dielectric layer having a certain refractive index is employed in front of the metal reflective film 25 in a direction in which light is made incident, the overall reflection characteristics can be improved. This will now be described in detail with reference to FIG. 2 and Table 1 below.

Figure 2:
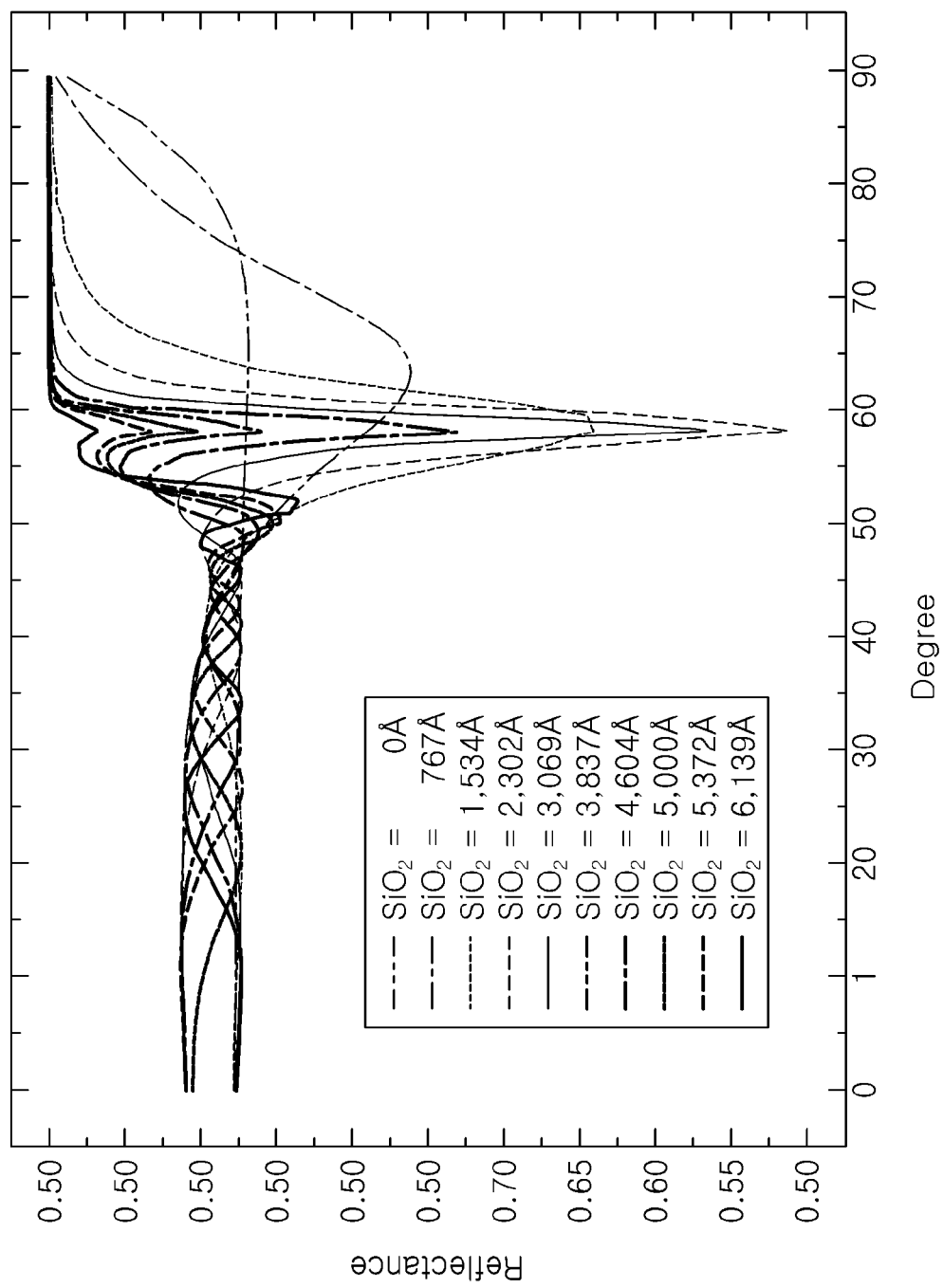
FIG. 2 is a graph of a change of reflectance over the thickness of an optical auxiliary layer made of $SiO_2$ in a rear reflective layer according to an embodiment of the present invention.

FIG. 2 is a graph of a change of reflectance according to incident angles over the thickness of an $SiO_2$ film when the $SiO_2$ film, an optical auxiliary layer, and the Al reflective metal layer (thickness: 2000 Å) are sequentially formed on the lower surface of the sapphire substrate, and Table 1 below shows the results of average reflectance calculated according to a change in the thickness of the $SiO_2$ film based on reflectance according to an incident angle shown in FIG. 2.

TABLE 1

| Thickness (Å) of $SiO_2$ film | Average reflectance (%) |
|---|---|
| None | 88.14 |
| 767 | 88.46 |
| 1534 | 88.81 |
| 2302 | 90.93 |
| 3069 | 91.30 |
| 3837 | 92.78 |
| 4604 | 92.75 |
| 5000 | 92.98 |
| 5372 | 93.36 |
| 6139 | 92.91 |

As shown in Table 1 together with the graph of FIG. 2, it is noted that reflectance is substantially improved when the refractive index layer (i.e., the optical auxiliary layer) interposed between the metal reflective film and the substrate is introduced. Also, when the thickness of the refractive index layer is about 2000 Å, a reflectance of substantially 90% or higher was obtained. When the substrate was made of sapphire and the metal reflective film was made of only aluminum (Al), reflectance was about 88.14%, but it is noted that reflectance was improved up to about 93.36% when the $SiO_2$ film having a thickness of about 5372 Å was interposed between the aluminum layer and the sapphire substrate.

In this manner, the rear reflective structure employed in the present embodiment provides high reflectance compared with the case in which only a metal reflective film is used alone, thus effectively contributing to a substantial improvement in luminance.

Also, the semiconductor LED chip 30 according to the present embodiment includes a junction lamination body AD formed on a lower surface of the rear reflective structure.

The junction lamination body AD includes a junction metal layer 27 made of a eutectic metal material and a diffusion barrier film 29 formed to prevent elements from being diffused between the junction metal layer 27 and the metal reflective film 25.

The eutectic metal material of the junction metal layer 27 may contain at least one of gold (Au), silver (Ag), and tin (Sn). Preferably, the eutectic metal material of the junction metal layer 27 may include gold (Au)-tin (Sn).

When an internal thermal resistance distribution of the LED structure 10, a portion which greatly affects a determination of heat release efficiency is considered to be the interface of the chip and the package. As for the thermal resistance at the interface, a eutectic junction can be implemented by using a eutectic alloy, rather than by using a general junction resin such as a silicon resin.

Figure 3:
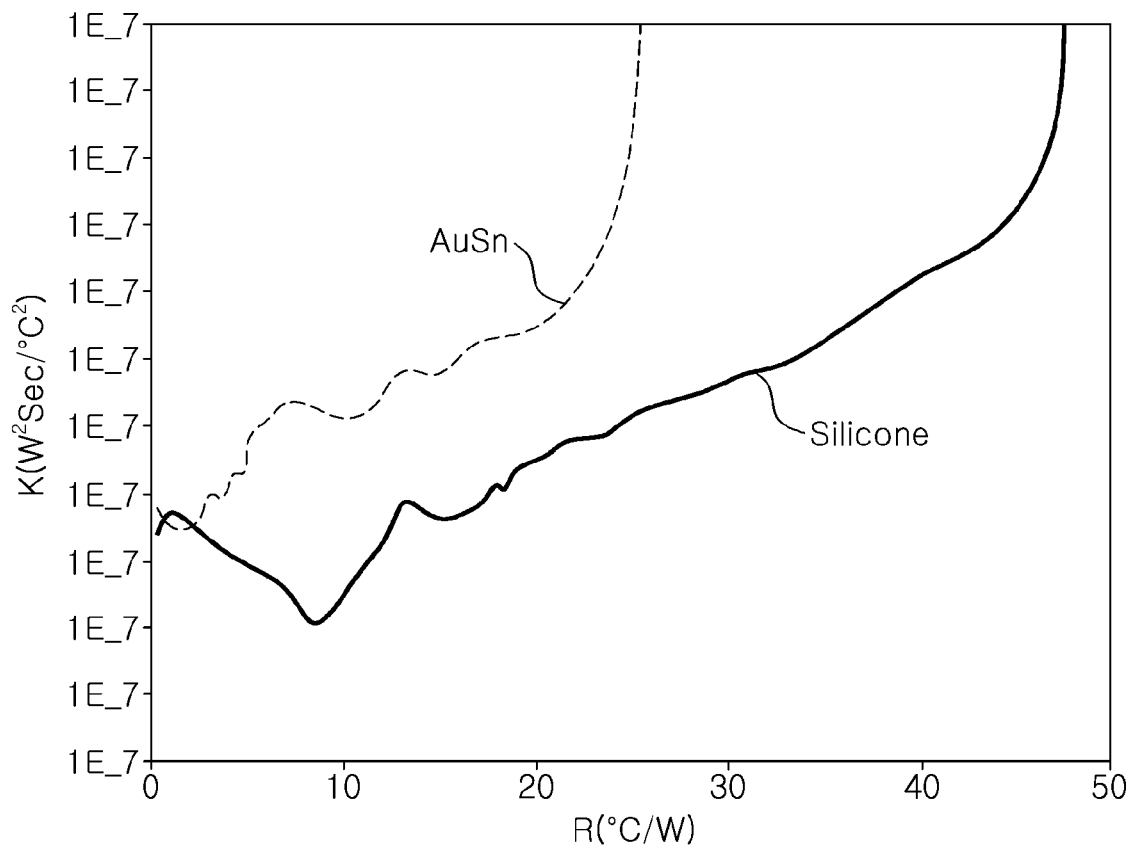
FIG. 3 is a graph showing a comparison between heat conductivity of a silicon junction resin and Ag—Sn which may be preferably used as a junction metal layer according to an embodiment of the present invention.

As shown in FIG. 3, the Au—Sn eutectic metal exhibits high thermal conductivity as compared with the silicon resin, so heat generated from the LED chip 30 can be effectively released through the eutectic junction interface in contact with the package.

Meanwhile, the constituent element of the junction metal layer 27, the foregoing eutectic metal, may be diffused to the adjacent reflective metal layer (e.g., Sn diffusion according to temperature and an electric field) to degrade reflective characteristics.

The diffusion barrier film 29 serves to prevent such a loss of reflective characteristics due to an undesired diffusion. The diffusion barrier film 29 may be made of a material selected from among titanium (Ti), nickel (Ni), chromium (Cr), gold (Au), TiW, TiN, and a combination thereof.

Figure 4:
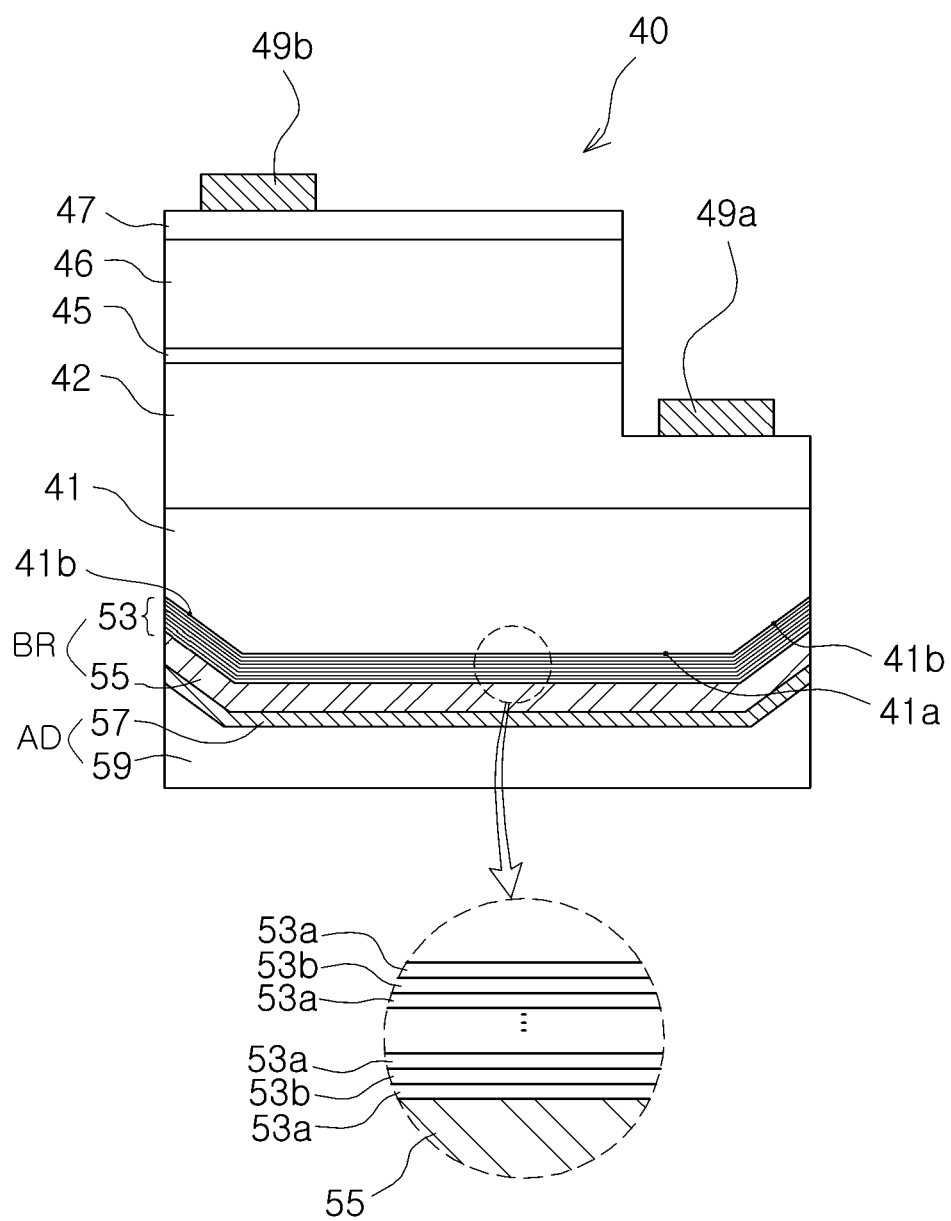
FIG. 4 is a side sectional view of a semiconductor light emitting device according to another embodiment of the present invention.

FIG. 4 is a side sectional view of a semiconductor light emitting device according to another embodiment of the present invention.

As shown in FIG. 4, a semiconductor LED chip 50 includes an LED structure 40 including an n type semiconductor layer 42, an active layer 45, and a p type semiconductor layer 46 sequentially stacked (or laminated) on a substrate 41.

The substrate 41 may be a light-transmissive substrate such as sapphire.

The light-transmissive substrate 41 employed in the present embodiment may have a face 41b sloped toward an upper face from the edges of the lower face 41a. Also, a rear reflective lamination body BR is formed on a lower face of the light-transmissive substrate 11 in order to change a direction of light to a desired direction (i.e., a direction in which an epitaxial layer is formed).

In such a structure, since the rear reflective lamination body BR is also formed on the sloped face 41b as well as on the lower face 41a of the light-transmissive substrate 41, emitted light can be effectively extracted in a desired direction (i.e., an upward direction), whereby high luminous intensity can be obtained and a high light harvesting effect can be expected.

The n type semiconductor layer 42, the active layer 45, and the p type semiconductor layer 46 may be nitride semiconductor layers.

Similar to the configuration as illustrated in FIG. 1, an n-sided electrode 49a is formed on an upper area of the n type semiconductor layer 42 exposed upon being mesa-etched, and a transparent electrode layer 47 and a p-sided electrode 49b are sequentially formed on an upper surface of the p type semiconductor layer 46. The active layer 45 may have a multi-quantum well structure including a plurality of quantum barrier layers and a plurality of quantum well layers.

As shown in FIG. 4, the semiconductor LED chip 50 has a rear reflective lamination body BR including an optical auxiliary layer 53 made of a material having a certain reflective index and a metal reflective film 55 formed on a lower face of the optical auxiliary layer 53.

Unlike the embodiment illustrated in FIG. 1, the optical auxiliary layer 53 may have a distributed Bragg reflector (DBR) structure in which two types of dielectric thin films 53a and 53b, each having a different refractive index, are alternately laminated. The two types of dielectric thin films 53a and 53b may be made of an oxide or a nitride including an element selected from the group consisting of silicon (Si), zirconium (Zr), tantalum (Ta), titanium (Ti), indium (In), tin (Sn), magnesium (Mg), and aluminum (Al).

The optical auxiliary layer 53 itself having a dielectric DBR structure employed in the present embodiment may have high reflectance of 90% or 95% or more.

The semiconductor LED chip 50 according to the present embodiment includes a junction lamination body AD formed on a lower surface of the rear reflective structure BR. The junction lamination body AD includes a junction metal layer 57 made of a eutectic metal material and a diffusion barrier film 59 formed to prevent elements from being diffused between the junction metal layer 57 and the metal reflective film 55.

The eutectic metal material of the junction metal layer 57 may contain at least one of gold (Au), silver (Ag), and tin (Sn).

The diffusion barrier film 59 serves to prevent a loss of reflection characteristics by an undesired diffusion of constituent elements of the junction metal layer 57. The diffusion barrier film 59 may be made of a material selected from among titanium (Ti), nickel (Ni), chromium (Cr), gold (Au), TiW, TiN, and a combination thereof.

The optical auxiliary layer 53 employed in the present embodiment is known to have high reflectance by itself, but it is difficult to expect to obtain excellent reflective characteristics when the optical auxiliary layer 53 is used alone or when the optical auxiliary layer 53 is not used along with a metal reflective film having high reflectance.

Experimental Example 1

Effect of DBR+Metal Reflective Film

In order to confirm the improvement effect of the reflective characteristics of the DBR+metal reflective film employed in the present embodiment, two DBR reflective structures were manufactured by alternatively depositing forty eight $SiO_2$ thin films and $Si_3N_4$ thin films (each being twenty four films).

An Al metal reflective film was additionally deposited on one face of one of the two DBR structures. Reflective characteristics of the DBR structure itself and the DBR+metal reflective structure obtained thus were measured as reflectance of each wavelength over incident angle, and FIGS. 5 and 6 show the results.

Figure 5:
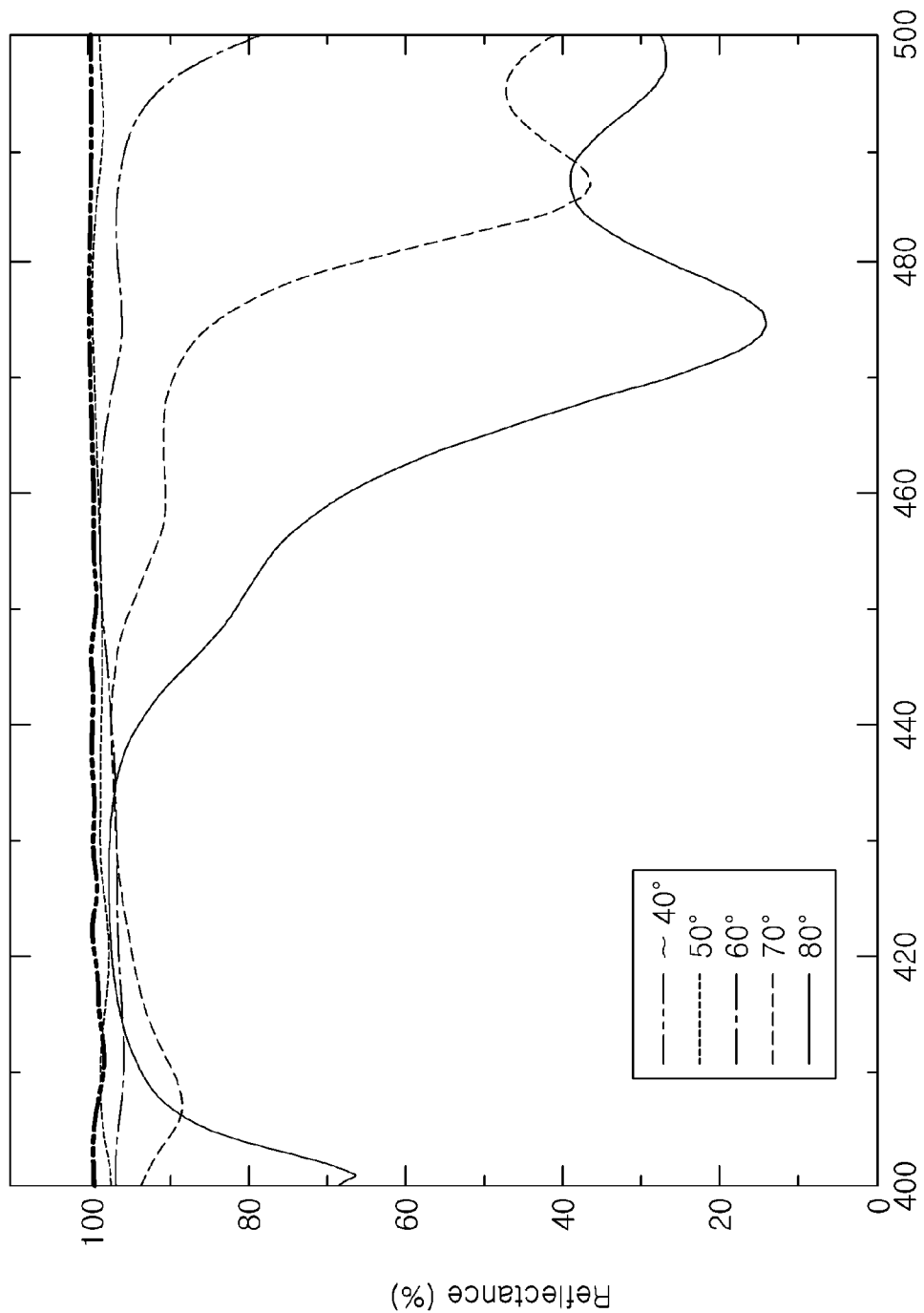
FIG. 5 is a graph showing a change in reflectance over an incident angle of a distributed Bragg reflector (DBR) structure itself (comparative example)
Figure 6:
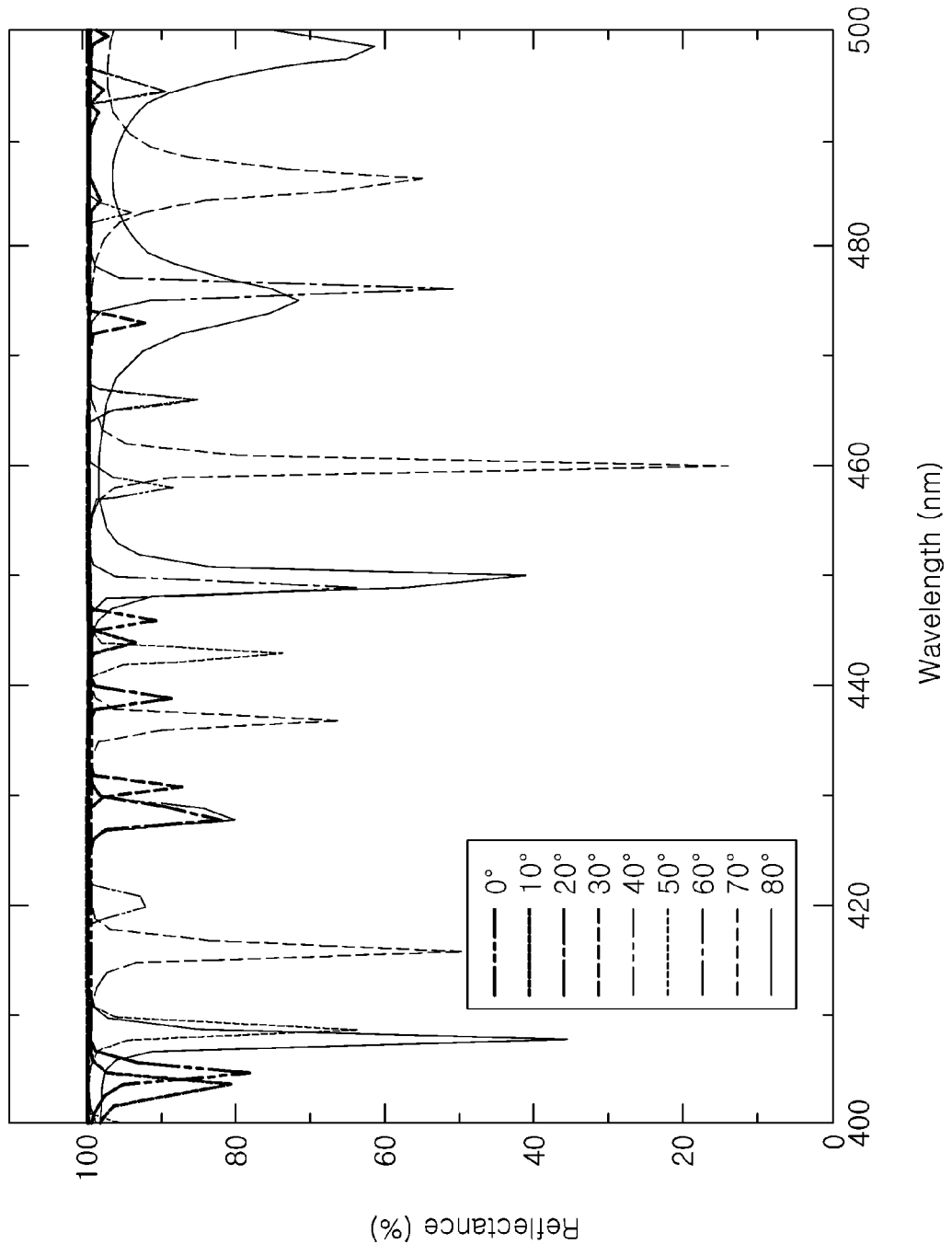
FIG. 6 is a graph showing a change in reflectance over an incident angle of a reflective structure which can be employed according to another embodiment of the present invention.

As shown in FIGS. 5 and 6, when the incident angle is small (about 50° or smaller), there is not much difference between the DBR structure and the DBR+metal reflective structure. But, in a case in which the incident angle is large, when only the DBR structure was used, its reflectance is greatly changed according to wavelength bands. Namely, when the wavelength was 440 nm or larger, the reflectance of the DBR structure tended to be considerably lowered, but the DBR+Al reflective film structure (See FIG. 6) was maintained to have high reflectance overall without excessive change, according to the incident angle.

In this manner, it was confirmed that, compared with the case of using the DBR structure alone, when the metal reflective film is additionally combined with the DBR structure, the change in reflectance according to the wavelength band and incident angle was reduced, to obtain excellent reflective characteristics overall.

Figure 7:
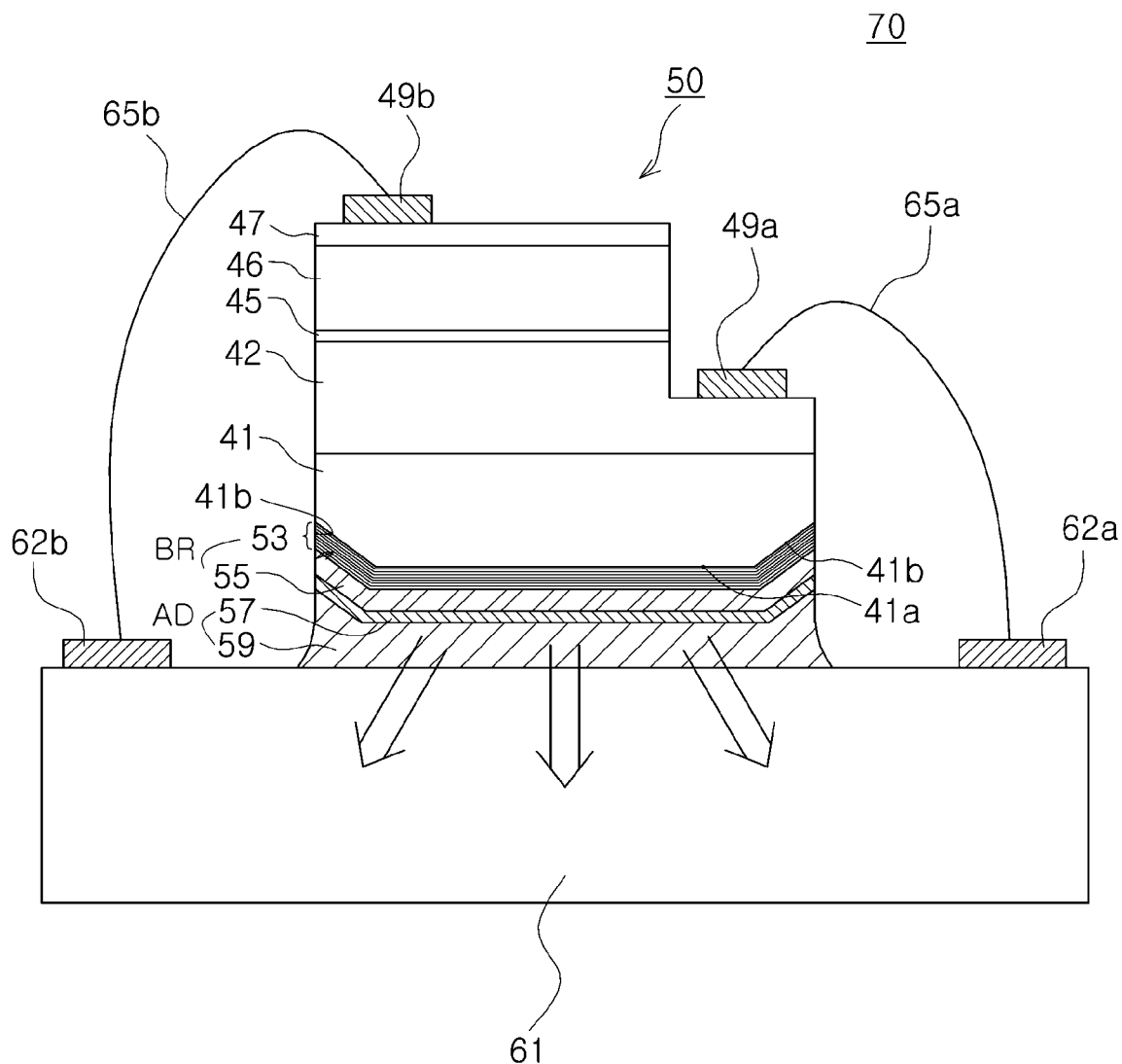
FIG. 7 is a view showing a light emitting device employing the semiconductor light emitting device illustrated in FIG. 4.

FIG. 7 is a view showing a light emitting device employing the semiconductor LED chip illustrated in FIG. 4.

With reference to FIG. 7, a semiconductor light emitting device 70 includes the LED chip 50 illustrated in FIG. 4 and a support 61.

The support 61 employed in the present embodiment is illustrated to have a structure including lead frames 62a and 62b for a connection with an external circuit. Each of the lead frames 62a and 62b may be electrically connected to the LED chip 50 through means such as wires 69a and 69b.

In the present embodiment, the LED chip 50 may be bonded with the support 61 through a fusion junction of the junction metal layer 59. As described above, heat (H) generated from the LED chip 50 can be effectively released by lowering thermal resistance by using the junction metal layer 59 made of the eutectic metal material at the interface of the chip 50 and the package which greatly affects in determining the heat release efficiency. The improvements of the heat release efficiency can be advantageously employed in a high output semiconductor light emitting device whose heat releasing function weighs especially.

Experimental Example 2

Effect of DBR+Metal Reflective Film

As described above, also in case in which the diffusion barrier film 57 or the eutectic metal layer 59 is directly applied without the metal reflective film 55 having high reflectance such as aluminum (Al) or silver (Ag), desired reflective characteristics can be hardly obtained, and such an effect of a package structure will now be checked through the embodiment and Comparative Example.

Embodiment

The DBR structure as shown in Experiment Example 1 was formed on a lower face (including a sloped face) of a sapphire substrate of a nitride LED, and an AL metal reflective film was deposited thereon. In addition, an Au—Sn junction metal layer was formed along with a Ti/Au diffusion barrier film as a junction lamination.

The LED chip manufactured thusly was bonded to a silicon sub-mount substrate by using the junction metal layer to manufacture a light emitting device having a structure similar to that illustrated in FIG. 7.

Comparative Example

In another example, a nitride semiconductor light emitting device chip was manufactured in a similar manner to that of Embodiment, except that Ti/Au was formed on the DBR structure, without depositing an Al metal reflective film thereon, and then, an LED chip was bonded to the silicon sub-mount substrate by using an Au—Sn junction metal layer to manufacture a white light emitting device.

Optical characteristics such as color temperature or color coordinates (or chromaticity), as well as luminous flux, of the light emitting device according to Embodiment of the present invention and those according to Comparative Example were measured. Table 2 shows the results.

TABLE 2

| Classification | Vf (V) | Luminous flux (lm) | Color temperature (CCT) | x | y |
|---|---|---|---|---|---|
| Embodiment | 3.39 | 104.9 | 4584 | 0.366 | 0.412 |
| Comparative Example | 3.38 | 94.2 | 4593 | 0.366 | 0.414 |

As shown in Table 2, there is little difference between the color characteristics such as color temperature or color coordinates, while the luminous flux of Embodiment was 104.9 lm and that of Comparative Example was 94.2 lm, making a difference of about 10%.

Such a difference is understood to be the result of bonding the metal layer used in the diffusion barrier film, rather than the metal reflective film such as aluminum (Al) having high reflectance, to the rear surface of the DBR structure, and as described above, it was confirmed that the structure of a DBR+metal reflective film having high reflectance can guarantee high luminous flux also in an actual package structure.

As set forth above, according to embodiments of the invention, since the structure including the combination of a reflective film and dielectric (or DBR layer) is employed, high reflective efficiency can be guaranteed and substantial luminance in a desired direction can be increased.

Also, since the eutectic alloy junction layer is as the junction structure on the interface of the LED chip and the package, heat releasing characteristics can be improved. In particular, since the diffusion barrier film is employed, an undesired element can be prevented from being diffused to the eutectic junction layer, thus preventing damage to the reflective structure.

While the present invention has been shown and described in connection with the embodiments, it will be apparent to those skilled in the art that modifications and variations can be made without departing from the spirit and scope of the invention as defined by the appended claims.

What is claimed is:

1. A semiconductor light emitting diode (LED) chip comprising:
  a light emitting diode unit including a light-transmissive substrate having a face sloped upwardly at a lower edge thereof, and a first conductive semiconductor layer, an active layer, and a second conductive semiconductor layer sequentially formed on the upper face of the light-transmissive substrate;
  a rear reflective lamination body formed on the lower face and the surrounding sloped face of the light-transmissive substrate and including an optical auxiliary layer made of a material having a certain refractive index and a metal reflective film formed on a lower face of the optical auxiliary layer; and
  a junction lamination body provided to a lower face of the rear reflective lamination body and including a junction metal layer made of a eutectic metal material and a diffusion barrier film formed to prevent an element from being diffused between the junction metal layer and the metal reflective film.

2. The semiconductor LED chip of claim 1, wherein the eutectic metal material of the junction metal layer contains at least one of gold (Au), silver (Ag), and tin (Sn).

3. The semiconductor LED chip of claim 2, wherein the eutectic metal material of the junction metal layer includes Au—Sn.

4. The semiconductor LED chip of claim 1, wherein the metal reflective film includes aluminum (Al), silver (Ag), and an alloy containing at least one of aluminum (Al) and silver (Ag).

5. The semiconductor LED chip of claim 1, wherein the diffusion barrier film includes a material selected from among titanium (Ti), nickel (Ni), chromium (Cr), gold (Au), TiW, TiN, and a combination thereof.

6. The semiconductor LED chip of claim 1, wherein the optical auxiliary layer is made of an oxide or a nitride including an element selected from the group consisting of silicon (Si), zirconium (Zr), tantalum (Ta), titanium (Ti), indium (In), tin (Sn), magnesium (Mg), and aluminum (Al).

7. The semiconductor LED chip of claim 1, wherein the optical auxiliary layer has a DBR structure in which two types of dielectric thin films, each having a different refractive index, are alternately laminated.

8. The semiconductor LED chip of claim 7, wherein the two types of dielectric thin films are made of an oxide or a nitride including an element selected from the group consisting of silicon (Si), zirconium (Zr), tantalum (Ta), titanium (Ti), indium (In), tin (Sn), magnesium (Mg), and aluminum (Al).

9. A semiconductor light emitting device comprising a semiconductor light emitting diode (LED) chip and a support supporting the semiconductor LED chip, wherein the semiconductor LED chip comprises:
   a light emitting diode unit including a light-transmissive substrate having a face sloped upwardly at a lower edge thereof, and a first conductive semiconductor layer, an active layer, and a second conductive semiconductor layer sequentially formed on the upper face of the light-transmissive substrate;
   a rear reflective lamination body formed on the lower face and the surrounding sloped face of the light-transmissive substrate and including an optical auxiliary layer made of a material having a certain refractive index and a metal reflective film formed on a lower face of the optical auxiliary layer; and
   a junction lamination body provided to a lower face of the rear reflective lamination body, having an interface fusion-bonded to the support, and including a junction metal layer made of a eutectic metal material and a diffusion barrier film formed to prevent an element from being diffused between the junction metal layer and the metal reflective film.

10. The semiconductor light emitting device of claim 9, wherein the eutectic metal material of the junction metal layer contains at least one of gold (Au), silver (Ag), and tin (Sn).

11. The semiconductor light emitting device of claim 10, wherein the eutectic metal material of the junction metal layer includes Au—Sn.

12. The semiconductor light emitting device of claim 9, wherein the metal reflective film includes aluminum (Al), silver (Ag), and an alloy containing at least one of aluminum (Al) and silver (Ag).

13. The semiconductor light emitting device of claim 9, wherein the diffusion barrier film includes a material selected from among titanium (Ti), nickel (Ni), chromium (Cr), gold (Au), TiW, TiN, and a combination thereof.

14. The semiconductor light emitting device of claim 9, wherein the optical auxiliary layer is made of an oxide or a nitride including an element selected from the group consisting of silicon (Si), zirconium (Zr), tantalum (Ta), titanium (Ti), indium (In), tin (Sn), magnesium (Mg), and aluminum (Al).

15. The semiconductor light emitting device of claim 9, wherein the optical auxiliary layer has a DBR structure in which two types of dielectric thin films, each having a different refractive index, are alternately laminated.

16. The semiconductor light emitting device of claim 15, wherein the two types of dielectric thin films are made of an oxide or a nitride including an element selected from the group consisting of silicon (Si), zirconium (Zr), tantalum (Ta), titanium (Ti), indium (In), tin (Sn), magnesium (Mg), and aluminum (Al).

* * * * *